(12) United States Patent
Fukushima et al.

(10) Patent No.: US 8,048,323 B2
(45) Date of Patent: Nov. 1, 2011

(54) METHOD FOR MANUFACTURING MAGNETIC RECORDING MEDIUM AND MAGNETIC RECORDING AND REPRODUCING APPARATUS

(75) Inventors: Masato Fukushima, Ichihara (JP); Akira Sakawaki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/515,370

(22) PCT Filed: Nov. 21, 2007

(86) PCT No.: PCT/JP2007/072994
§ 371 (c)(1),
(2), (4) Date: Jul. 15, 2009

(87) PCT Pub. No.: WO2008/069082
PCT Pub. Date: Jun. 12, 2008

(65) Prior Publication Data
US 2010/0053813 A1   Mar. 4, 2010

(30) Foreign Application Priority Data
Nov. 27, 2006 (JP) .................................. 2006-318839

(51) Int. Cl.
*G11B 5/84* (2006.01)

(52) U.S. Cl. ................ 216/22; 216/41; 216/44; 216/47; 216/51; 216/67; 216/75

(58) Field of Classification Search .................. None
See application file for complete search history.

(56) References Cited

U.S. PATENT DOCUMENTS

| | | | | |
|---|---|---|---|---|
| 6,753,043 B1 * | 6/2004 | Kuo et al. | | 427/526 |
| 6,753,130 B1 * | 6/2004 | Liu et al. | | 430/313 |
| 6,864,042 B1 * | 3/2005 | Kuo et al. | | 430/320 |

(Continued)

FOREIGN PATENT DOCUMENTS

CN     1143246 A     2/1997

(Continued)

OTHER PUBLICATIONS

Edi Suharyadi, et al., "Fabrication of Patterned Co/Pd Nanostructures Using E-Beam Lithography and Ga Ion-Irradiation", The Institute of Electronics, Information and Communication Engineers, 2006, pp. 21-26, MR2005-55.

*Primary Examiner* — Anita Alanko
(74) *Attorney, Agent, or Firm* — Sughrue Mion, PLLC (57) ABSTRACT

A method for manufacturing a magnetic recording medium (30) having magnetically separate magnetic recording patterns on at least one surface of a nonmagnetic substrate (1), includes the steps of forming a magnetic layer (2) on the nonmagnetic substrate, forming a mask layer (3) on the magnetic layer, forming a resist layer (4) on the mask layer, transferring negative patterns of the magnetic recording patterns to the resist layer using a stamp (5), removing portions of the mask layer which correspond to the negative patterns of the magnetic recording patterns, implanting ions in the magnetic layer from a resist layer-side surface to partly demagnetize the magnetic layer, and removing the resist layer and the mask layer. A magnetic recording and reproducing apparatus includes the above magnetic recording medium (30), a driving section (11) that drives the magnetic recording medium in a recording direction, a magnetic head (27) including a recording section and a reproducing section, a device (28) for moving the magnetic head relative to the magnetic recording medium, and recording and reproducing signal processing device (29) for inputting a signal to the magnetic head and reproducing an output signal from the magnetic head.

8 Claims, 3 Drawing Sheets

U.S. PATENT DOCUMENTS

| | | |
|---|---|---|
| 7,067,207 B2 | 6/2006 | Kamata et al. |
| 7,147,790 B2 | 12/2006 | Wachenschwanz et al. |
| 7,549,209 B2 | 6/2009 | Wachenschwanz et al. |
| 7,820,064 B2 * | 10/2010 | Jin ................................ 216/41 |
| 2005/0036223 A1 | 2/2005 | Wachenschwanz et al. |
| 2005/0220991 A1 | 10/2005 | Aoyama et al. |
| 2006/0141141 A1 | 6/2006 | Kamata et al. |
| 2006/0203368 A1 * | 9/2006 | Kaizu et al. ..................... 360/48 |
| 2007/0039922 A1 | 2/2007 | Wachenschwanz et al. |
| 2007/0041306 A1 | 2/2007 | Wachenschwanz et al. |

FOREIGN PATENT DOCUMENTS

| | | |
|---|---|---|
| EP | 0 671 726 A2 | 9/1995 |
| JP | 62162326 A * | 7/1987 |
| JP | 05-205257 A | 8/1993 |
| JP | 2002-288813 A | 10/2002 |
| JP | 2004-164692 A | 6/2004 |
| JP | 2004-178793 A | 6/2004 |
| JP | 2004-178794 A | 6/2004 |
| JP | 2005-228913 A | 8/2005 |
| JP | 2006-260741 A | 9/2006 |

* cited by examiner

METHOD FOR MANUFACTURING MAGNETIC RECORDING MEDIUM AND MAGNETIC RECORDING AND REPRODUCING APPARATUS

CROSS REFERENCE TO RELATED APPLICATION

This application is an application filed under 35 U.S.C. §119(e)(1) of the filing date of Japanese Patent application No. 2006-318839 filed Nov. 27, 2006 pursuant to 35 U.S.C. §111(b).

TECHNICAL FIELD

The present invention relates to a method for manufacturing a magnetic recording medium for use in a hard disk drive and the like, and a magnetic recording and reproducing apparatus.

BACKGROUND ART

The application range of magnetic recording drives, such as magnetic disk drives, flexible disk drives and magnetic tape drives, has recently been significantly extended, making these magnetic recording drives more important. For magnetic recording media used in these drives, efforts have been made to markedly improve recording density. In particular, since the introduction of an MR head and a PRML technique, surface recording density has been further significantly increased. In recent years, a GMR head and a TMR head have also been introduced to increase the recording density at a rate of as much as 100% per year. The magnetic recording media have been demanded to achieve a much higher recording density in the future. Thus, there has been a demand for an increase in the coersive force, signal-to-noise ratio (SNR) and resolution of a magnetic recording layer. Furthermore, efforts have been made to increase linear recording density as well as track density in order to improve the surface recording density.

The latest magnetic recording drives have a track density of as much as 110 kTPI. However, increasing the track density is disadvantageously likely to cause magnetically recorded data in adjacent tracks to interfere with each other. A magnetization transition region in the boundary between the adjacent tracks may then serves as a noise source to reduce the SNR. This leads directly to a decrease in bit error rate, hindering the enhancement of the recording density.

To increase the surface recording density, it is necessary to reduce the size of recording bits on the magnetic recording medium to ensure as high saturation magnetization and as large a magnetic film thickness as possible for each recording bit. However, a reduction in the size of recording bits may disadvantageously decrease the minimum magnetization volume per bit, resulting in heat fluctuation. Magnetization reversal may men occur to eliminate the recorded data.

Furthermore, the resulting decrease in inter-track distance leads to the need for a very highly accurate track servo technique for the magnetic recording drive. Further, a method is generally used, which uses a wide recording range and a reproducing range that is narrower than the recording range in order to eliminate the adverse effect by the adjacent tracks as much as possible. This method can suppress the effect between tracks to the minimum. However, this may disadvantageously make it difficult to obtain sufficient reproduction outputs and to thus ensure a sufficient SNR.

To avoid the heat fluctuation problem and to ensure a sufficient SNR and sufficient outputs, an attempt has been made to form recesses and protrusions on the surface of the recording medium along the tracks to physically separate the recording tracks from one another in order to increase the track density. This technique is hereinafter referred to as a discrete track method. A magnetic recording medium manufactured by the discrete track method is hereinafter referred to as a discrete track medium.

A known example of the discrete track medium is a magnetic recording medium formed on a nonmagnetic substrate having recess and protrusion patterns on a surface thereof to form physically separate magnetic recording tracks and servo signal patterns (see, for example, JP-A 2004-164692).

This magnetic recording medium has a ferromagnetic layer formed, via a soft magnetic layer, on the surface of a substrate on which a plurality of recesses and protrusions are formed. A protective film is formed on the surface of the substrate. The magnetic recording medium has a magnetic recording region formed thereon in the area of the protrusions and physically separated from surroundings.

The magnetic recording medium can inhibit the formation of magnetic domain walls in the soft magnetic layer, avoiding the adverse effect by heat fluctuation and the interference between the adjacent signals. This makes it possible to provide a high-density magnetic recording medium mat can minimize possible noise.

The discrete track method includes a method of forming tracks after forming a magnetic recording medium made up of a number of layers of thin films and a method of forming thin films for the magnetic recording medium after forming recess and protrusion patterns directly on the substrate surface or in a mm film layer mw JP-A 2004-178793 and JP-A 2004-178794). The former method is often called a magnetic layer processing method and performs physical processing on the surface after the formation of the medium. Unfortunately, the medium is thus prone to be contaminated during the manufacturing process, which is very complicated. The latter method is often called an embossing method. This method prevents the medium from being contaminated during the manufacturing process. However, the film formed takes over the recess and protrusion shapes formed on the substrate, preventing the stabilization of the floating posture and height of a recording and reproducing head performing the recording and reproducing operations while floating over the medium.

A method has also been disclosed, which involves forming inter-track regions in the discrete track medium by implanting nitrogen or oxygen ions in the preformed magnetic layer or irradiating the magnetic layer with a laser (see JP-A HEI 5-205257). However, the inter-track regions formed by this method offer reduced saturation magnetization but increased coersive force. Consequently, an insufficient magnetization state remains, resulting in blurring when information is written on the magnetic track portion.

A method has also been disclosed, which involves manufacturing what is called a patterned medium having magnetic recording patterns arranged with a specified bit-by-bit regularity wherein the magnetic recording pattern are formed by etching based on ion irradiation (see IEICE Technical Report MR2005-55 (2006-02), pp. 21-26 (The Institute of Electronics, Information and Communication Engineers)). However, even with this method, disadvantageously, the magnetic recording medium may be contaminated during the manufacturing process. Furthermore, the smoothness of the surface may be degraded.

For magnetic recording apparatuses that face technical difficulties associated with the increased recording density, the present invention drastically increases the recording density while ensuring recording and reproducing properties equivalent or superior to those achieved by the conventional techniques. The present invention also reduces the coersive force and remanent magnetization in the inter-pattern regions to the minimum to prevent possible blurring during magnetic recording. This increases the surface recording density. In particular, for discrete-track magnetic recording media manufactured by forming recesses and protrusions on a magnetic layer preformed on the substrate, the present invention eliminates a magnetic layer removing step executed for the conventional magnetic layer processing method, substantially simplifying the manufacturing process. The present invention also provides a manufacturing method with reduced contamination risks and a useful magnetic recording medium with an excellent head floating property.

Through dedicated efforts to accomplish the above object, the present inventors have reached the present invention.

DISCLOSURE OF THE INVENTION

The present invention provides as the first aspect thereof a method for manufacturing a magnetic recording medium having magnetically separate magnetic recording patterns on at least one surface of a nonmagnetic substrate, the method including the steps of forming a magnetic layer on the nonmagnetic substrate; forming a mask layer on the magnetic layer, forming a resist layer on the mask layer, transferring negative patterns of the magnetic recording patterns to the resist layer using a stamp; removing portions of the mask layer which correspond to the negative patterns of the magnetic recording patterns; implanting ions in the magnetic layer from a resist layer-side surface to partly demagnetize the magnetic layer, and removing the resist layer and the mask layer.

In the second aspect of the invention that includes the method of the first aspect, the mask layer formed on the magnetic layer has a shielding ability S to shield the implanted ions that meets: $S=(Mrt_{initial}-Mrt_{after})/Mrt_{initial}$ and $0.5 \leq S \leq 1$ where $Mrt_{initial}$ denotes an amount of remanent magnetization in the magnetic layer before ion implantation, and $Mrt_{after}$ denotes an amount of remanent magnetization in the magnetic layer after implantation of 20-keV argon at a dose of $5\times10^{16}/cm^2$.

In the third aspect of the invention that includes the method of the first aspect, the mask layer formed on the magnetic layer has a magnetic recording pattern formation property L that meets: $L=(L_{after}-L_{initial})/L_{initial}$ and $0 \leq L \leq 0.2$ where $L_{initial}$ denotes a width of each negative pattern in the magnetic recording patterns, and $L_{after}$ denotes a width of a demagnetized pattern after implantation of the ions into the magnetic layer via patterns of the mask layer.

In the fourth aspect of the invention that includes the method of the first aspect, the mask layer formed on the magnetic layer includes at least one layer of one species selected from the group consisting of Ta, W, Ta nitride, W nitride, Si, $SiO_2$, $Ta_2O_5$, Re, Mo, Ti, V, Nb, Sn, Ga, Ge, As and Ni.

In the fifth aspect of the invention mat includes the method of the first aspect, the mask layer formed on the magnetic layer has a multilayer structure.

In the sixth aspect of the invention that includes the method of the first aspect, the mask layer formed on the magnetic layer is made of a material containing one species selected from the group consisting of Ta, W, Mo, Ti, Nb and As, and the step of removing the mask layer is a dry etching step using a gas containing F.

In the seventh aspect of the invention that includes the method of the first aspect, the mask layer farmed on the magnetic layer is made of a material containing Ni, and the step of removing the mask layer is a dry etching step using a gas containing CO.

In the eighth aspect of the invention that includes the method of the first aspect, the mask layer formed on the magnetic layer is made of a material containing Sn or Ga, and the step of removing the mask layer is a dry etching step using a gas containing Cl.

In the ninth aspect of the invention that includes the method of the first aspect, the mask layer formed on the magnetic layer is made of a material containing Ge, and the step of removing the mask layer is a dry etching step using a gas containing Br.

In the tenth aspect of the invention that includes the method of the first aspect, the resist layer has recesses formed therein after the step of transferring the negative patterns of the magnetic recording patterns to the resist layer, which have a thickness ma range of 0 to 10 nm.

In the eleventh aspect of the invention mat includes the method of the tenth aspect, the resist layer having the recesses formed therein after the step of transferring the negative patterns of the magnetic recording patterns to the resist layer has a side portion forming an angle in a range of 90 to 70° relative to a surface of the nonmagnetic substrate.

In the twelfth aspect of the invention that includes the method of the first aspect, the resist layer is made of a material cured by irradiation with radioactive rays, and the resist layer is irradiated with radioactive rays during or after the step of transferring the negative patterns to the resist layer using the stamp.

In the thirteenth aspect of the invention that includes the method of the twelfth aspect, the radioactive rays are ultraviolet rays.

The present invention further provides as the fourteenth aspect thereof a magnetic recording and reproducing apparatus comprising: the magnetic recording medium manufactured using the method according to any one of the first to thirteenth aspects; a driving section that drives the magnetic recording medium in a recording direction; a magnetic head comprising a recording section and a reproducing section; means for moving the magnetic head relative to the magnetic recording medium; and recording and reproducing signal processing means for inputting a signal to the magnetic head and reproducing an output signal from the magnetic head.

The present invention can provide a magnetic recording medium manufactured by forming the magnetic recording patterns after forming the magnetic layer on the nonmagnetic substrate, the magnetic recording medium enabling the stability of head floating to be ensured, having an excellent capability of separating the magnetic recording patterns from one another, preventing the possible adverse effect by the interference between signals from the adjacent patterns, and offering an excellent recording density property. The present invention can also eliminate the need for the following steps from the magnetic layer processing method, which has been considered to be very complicated: a step of removing the magnetic layer by dry etching, a subsequent burying step, and a subsequent step of re-burying etched-away portions to form a film. This contributes significantly to enhancing the productivity.

Furthermore, the magnetic recording and reproducing apparatus in accordance with the present invention uses the magnetic recording medium in accordance with the present invention. The present invention thus provides a magnetic recording and reproducing apparatus having an excellent head floating property, having an excellent capability of separating the magnetic recording patterns from one another, and preventing the possible adverse effect by the interference between signals from the adjacent patterns, thus offering an excellent recording density property.

BEST MODE FOR CARRYING OUT THE INVENTION

Specific description will be given of a method for manufacturing a magnetic recording medium in accordance with the present invention, by way of a discrete magnetic recording medium as an example.

Figure 1:
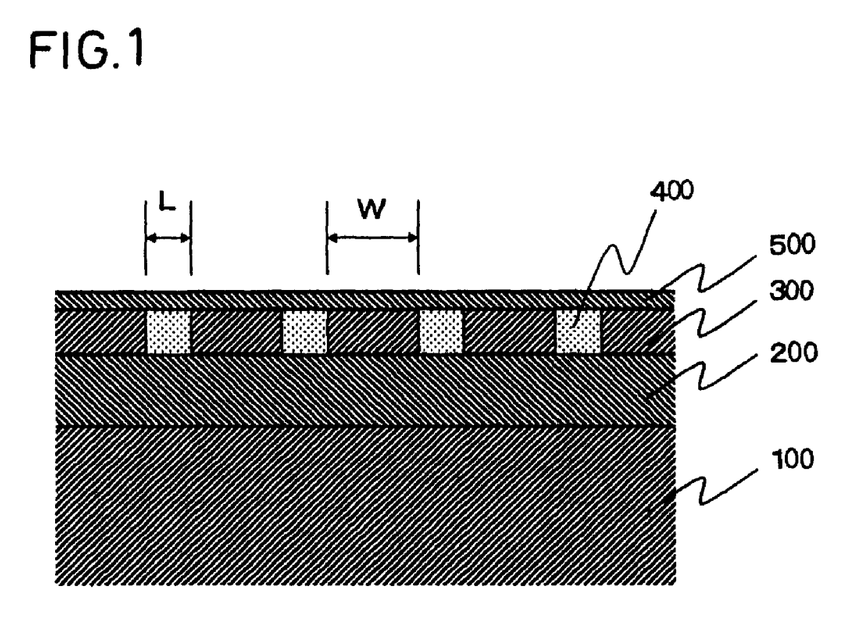
FIG. 1 is a schematic view showing the sectional structure of a magnetic recording medium in accordance with the present invention.

FIG. 1 shows the sectional structure of a discrete magnetic recording medium as an example of the present invention. The magnetic recording medium in accordance with the present invention has sequentially formed, on a nonmagnetic substrate 100, a soft magnetic layer and intermediate layer 200, a magnetic layer 300 with magnetic patterns farmed therein, a nonmagnetic layer 400 and a protective film layer 500. A lubricating film (not shown) is formed on the top surface of the magnetic recording medium.

For the magnetic recording medium in accordance with the manufacturing method of the present invention, the magnetic layer 300 with the magnetic patterns preferably has a magnetic portion width W of 200 nm or less and a nonmagnetic portion width L of 100 nm or less in order to increase the recording density. Thus, a track pitch P (=W+L) is 300 nm or less and is made as small as possible in order to increase the recording density.

The nonmagnetic substrate 100, used for the manufacturing method in accordance with the present invention, may be made of an Al alloy, such as an Al—Mg alloy composed mainly of Al, ordinary soda glass, aluminosilicate-based glass, any of various crystallized glass species, silicon, titanium, ceramics or any of various resins. In particular, an Al alloy substrate, a glass substrate of crystallized glass or a silicon substrate is preferably used. These substrates preferably have an average surface roughness (Ra) of 1 nm or less, more preferably 0.5 nm or less, most preferably 0.1 nm or less.

The magnetic layer formed on the surface of the nonmagnetic substrate may be an in-plane magnetic recording layer or a vertical magnetic recording layer. However, to achieve a high recording density, the vertical magnetic recording layer is preferably used. These magnetic recording layers are preferably formed of an alloy composed mainly of Co.

For example, as a magnetic recording layer for the in-plane magnetic recording medium, a stacked structure may be used which is made up of a nonmagnetic CrMO underlayer and a ferromagnetic CoCrPtTa magnetic layer.

As a magnetic recording layer for the vertical magnetic recording medium, it is possible to use, for example, a stacked structure of a backing layer made of a soft magnetic FeCo alloy (FeCoB, FeCoSiB, FeCoZr, FeCoZrB, FeCoZrBCu or the like), an FeTa alloy (FeTaN, FeTaC or the like), a Co alloy (CoTaZr, CoZrNB, CoB or the like), etc., an orientation control film made of Pt, Pd, NiCr, NiFeCr, etc, and if required, an intermediate film made of Ru etc. and a magnetic layer made of 60Co-15Cr-15Pt alloy or 70Co-5Cr-15Pt-10SiO$_2$ alloy.

The thickness of the magnetic recording layer 300 is between 3 nm and 20 nm inclusive, preferably between 5 nm and 15 nm inclusive. The magnetic recording layer may be formed so as to provide sufficient head outputs and inputs in accordance with the kind of the magnetic alloy and stacked structure used. To provide at least specified cutouts during reproduction, the magnetic layer needs to have at least a certain level of magnetic layer film thickness. On the other hand, the values of parameters indicating the recording and reproducing properties generally decrease with increasing magnitude of cutouts and therefore the magnetic layer needs to be set to have an optimum film thickness.

Generally, the magnetic recording layer is formed as a thin film by sputtering.

The protective film layer 500 is formed on the surface of the magnetic recording layer. The protective film layer may be a carbonaceous layer of carbon (C), hydrogenated carbon (H$_x$C), carbon nitride (CN), amorphous carbon or silicon carbide (SiC), or an ordinary protective film layer made of SiO$_2$, Zr$_2$O$_3$, TiN etc.

The film thickness of the protective film layer 500 needs to be less than 10 nm. The film thickness of the protective film layer exceeding 10 nm increases the distance between the head and the magnetic layer, preventing the output and input signal from exhibiting a sufficient intensity. The protective film layer is generally formed by sputtering or CVD.

In the present invention, nonmagnetic portions that magnetically separate magnetic recording tracks, servo signal pattern portions and magnetic recording bits from one another are formed by implanting ions in a magnetic layer already formed to demagnetize the magnetic layer. This method thus reduces the coersive force and remanent magnetization in the inter-track regions to the minimum to prevent possible blurring during magnetic recording. The method thus provides a magnetic recording medium with a high surface recording density.

According to the present invention, the magnetic layer may be partly demagnetized by implanting ions partly in the magnetic layer to change the crystal structure of the magnetic layer to eliminate the magnetism of the magnetic layer. Alternatively, the magnetic layer may be demagnetized by implanting ions partly in the magnetic layer to make the magnetic layer amorphous. Here, making the magnetic layer amorphous means making the atomic arrangement of the magnetic layer irregular so that the arrangement has no long-range order. More specifically, making the magnetic layer amorphous means modifying the magnetic layer so that microcrystal grains of size less than 2 nm are randomly arranged in the layer. The magnetic layer is determined to have this atomic arrangement when X-ray diffraction or electron diffraction shows no peak corresponding to a crystal face but only halo patterns.

Figure 2:
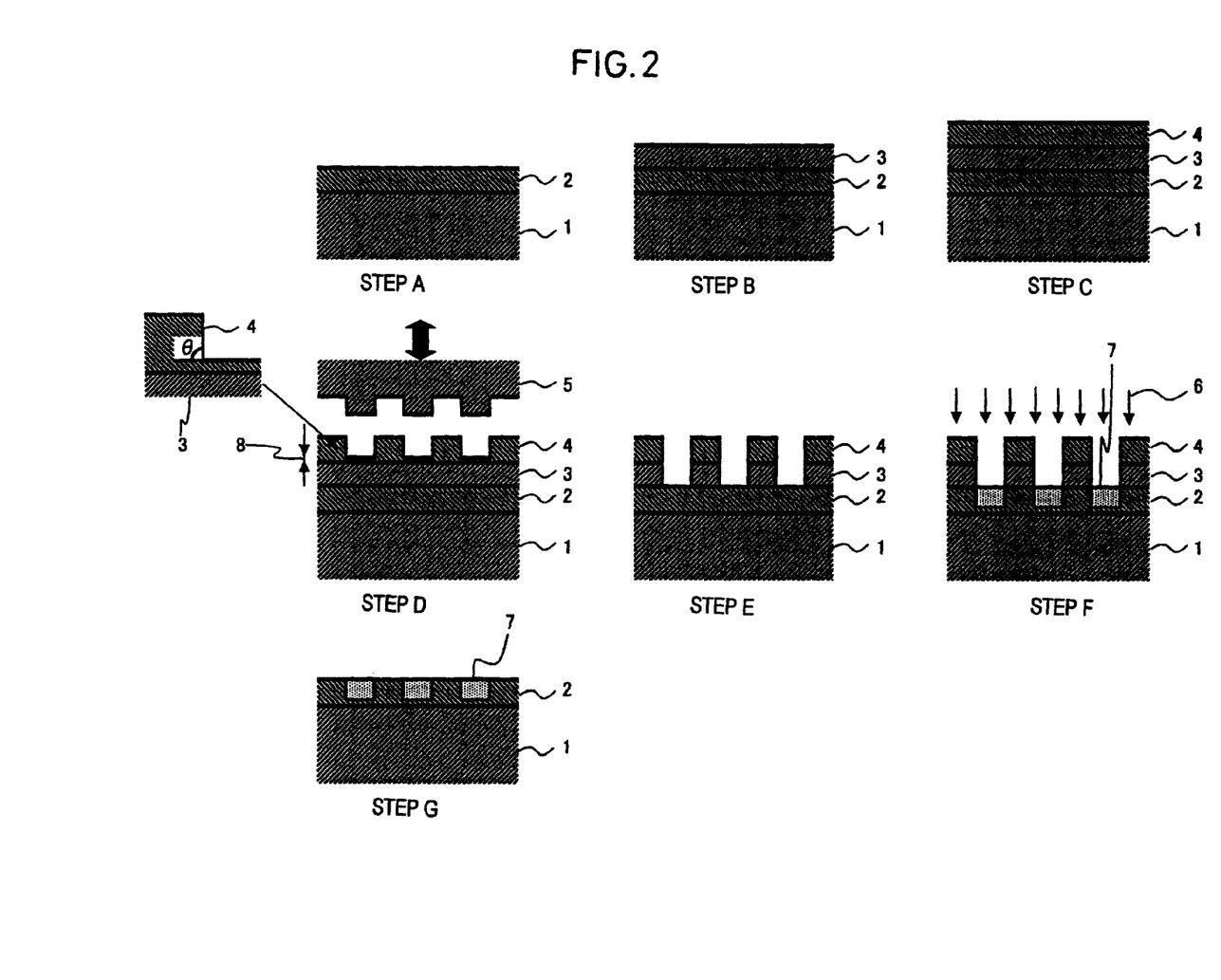
FIG. 2 is a schematic view showing a process of manufacturing a magnetic recording medium in accordance with the present invention.

With reference to FIG. 2, the description will be given of the method for manufacture a magnetic recording medium in accordance with the present invention. The present invention provides a method for manufacturing a magnetic recording medium having magnetically separate magnetic recording patterns on at least one surface of a nonmagnetic substrate, the method including step A of forming at least a magnetic layer 2 on the nonmagnetic substrate 1, step B of forming a mask layer 3 on the magnetic layer 2, step C of forming a resist layer 4 on the mask layer 3, step D of transferring negative patterns of the magnetic recording patterns to the resist layer 4 using a stamp 5 (bold arrow in step D shows the operation of the stamp 5), step E of removing portions of the mask layer which correspond to the negative patterns of the magnetic recording patterns, step F of implanting ions 6 in the magnetic layer 2 from the side surface of the resist layer 4 to partly demagnetize the magnetic layer (reference numeral 7 denotes the partly demagnetized portions of the magnetic layer), and step G of removing the resist layer 4 and the mask layer 3, wherein the steps (A) to (G) are executed in this order.

The magnetically separate magnetic recording patterns in the present invention mean that the magnetic layer 2 is separated into pieces by the demagnetized regions 7 as viewed from the front surface of the magnetic recording medium, as shown in step G in FIG. 2. That is, provided that the magnetic layer 2 is separated into pieces as viewed from the front surface, the object of the present invention can be achieved even when the magnetic layer 2 is not separated into pieces at the bottom thereof. This structure is thus included in the concept of the magnetically separate magnetic recording patterns. Furthermore, the magnetic recording patterns in accordance with the present invention include what is called a patterned medium having magnetic recording patterns arranged thereon with a specified bit-by-bit regularity, a medium having magnetic recording patterns arranged thereon like tracks, and servo signal patterns.

In view of the simplicity and convenience in the manufacturing process, the present invention is preferably applied to a discrete magnetic recording medium having magnetic recording tracks and servo signal patterns corresponding to the magnetically separate magnetic recording patterns.

Unlike the conventional manufacturing method, the method for manufacturing the magnetic recording medium in accordance with the present invention excludes the step of, in magnetically separating the magnetic recording pattern portion into pieces, physically separating the magnetic recording patterns from one another by dry etching, stamp processing or the like. This makes it possible to increase the smoothness of the magnetic recording medium surface and to reduce surface contamination, associated with etching of the magnetic film. Furthermore, the method for manufacturing the magnetic recording medium in accordance with the present invention uses the mask layer formed on the magnetic layer by sputtering or the like to implant ions for forming the magnetic recording patterns. This increases the number of choices for materials that can be utilized as the mask layer, making it possible to improve the ability to shield ions when ions are implanted in the magnetic layer. The properties of the magnetic recording patterns formed are thus improved, enabling a reduction in the coersive force and remanent magnetization in the inter-pattern region to the fullest extent and a reduction in blurring during magnetic recording.

In the method for manufacturing the magnetic recording medium in accordance with the present invention, the shielding ability S of the mask layer formed on the magnetic layer to shield the implanted ions meets Formula (1) below:

$$S = (Mrt_{initial} - Mrt_{after})/Mrt_{initial} \text{ and } 0.5 \leq S \leq 1 \quad (1)$$

The shielding ability S is more preferably $0.8 \leq S \leq 1$. In Formula (1) $Mrt_{initial}$ denotes the amount of remanent magnetization in the magnetic film before ion implantation, and $Mrt_{after}$ denotes the amount of remanent magnetization in the magnetic film after implantation of 20-keV argon at a dose of $5 \times 10^{16}/cm^2$. In the present invention, the value of the shielding ability S smaller man 0.5 prevents the magnetic regions from being sufficiently separated from the nonmagnetic regions, disadvantageously resulting in the high likelihood of unclear magnetic patterns. The upper limit of the value of the shielding ability S is 1.

In the method for manufacturing the magnetic recording medium in accordance with the present invention, the magnetic recording pattern formation property L of the mask layer formed on the magnetic layer meets Formula (2) below:

$$L = (L_{after} - L_{initial})/L_{initial} \text{ and } 0 \leq L \leq 0.2 \quad (2)$$

In Formula (2), $L_{initial}$ denotes the width of the negative pattern in the magnetic recording pattern, and $L_{after}$ denotes the width of the demagnetized pattern after implantation of ions into the magnetic layer via the patterns on the mask layer. The value of the magnetic recording pattern formation property L larger than 0.2 makes recording width larger than a predetermined track width, disadvantageously resulting in the high likelihood of the interference between the adjacent tracks. The lower limit of the value of the magnetic recording formation property L is 0.

In the method for manufacturing the magnetic recording medium in accordance with the present invention, the mask layer formed on the magnetic layer is preferably formed of a material containing at least one species selected from the group consisting of Ta, W, Ta nitride, W nitride, Si, $SiO_2$, $Ta_2O_5$, Re, Mo, Ti, V, Nb, Sn, Ga, Ge, As and Ni. These materials enables the enhancement of the shielding ability S of the mask layer to shield implanted ions and the magnetic recording pattern formation property L of the mask layer. Moreover, these substances are easily etched by dry etching using a reactive gas. This makes it possible to reduce residues and thus contamination of the surface of the magnetic recording medium in step G in FIG. 2.

In the method for manufacturing the magnetic recording medium in accordance with the present invention, among the above substances, As, Ge, Sn or Ga is preferably used as a material for the mask layer. Use of Ni, Ti, V or Nb is more preferable, and use of Mo, Ta or W is most preferable.

In the method for manufacturing the magnetic recording medium in accordance with the present invention, the mask layer preferably has a multilayer structure. Even with a resist with a small etching selection ratio, this structure enables the following operation, in which a first mask layer immediately below the resist is processed and the first mask layer is then used to make the formation of a second mask layer easier. This contributes to the productivity. For example, it is preferable to use a stacked structure in which the first mask layer is made of Ni and in which the second mask layer is made of W or Ta.

In the method for manufacturing the magnetic recording medium in accordance with the present invention, the mask layer formed on the magnetic layer is made of a material containing any one of Ta, W, Mo, Ti, Nb and As, and the step of removing the mask layer is a dry etching step using a gas containing F. Besides the fluorine gas, a $CF_4$ gas is preferably used as the gas containing F. These gases allow the mask layer to be efficiently dry-etched and make it possible to reduce residues resulting from the dry etching as well as contamination of the surface of the magnetic recording medium. For example, if a $CF_4$ gas is used to dry-etch a layer containing Ta, W, Mo, Ti, Nb or As, these elements can be gasified into $TaF_5$, $WF_6$, $MoF_6$, $TiF_4$, $NbF_5$ or $AsF_5$, respectively, for removal.

In the method for manufacturing the magnetic recording medium in accordance with the present invention, the mask layer formed on the magnetic layer is made of a material containing Ni, and the step of removing the mask layer is a dry-etching step using a gas containing CO or wet-etching step using an etchant containing nitric acid. The CO gas enables the mask layer containing Ni to be converted into an Ni(CO)$_4$ gas for etching-away. The CO gas also makes it possible to reduce residues resulting from the dry etching as well as contamination of the surface of the magnetic recording medium. For wet etching, the CO gas enables selective etching when a thin film made of a metal alloy, witch does not react with the etchant, such as Co-, Cr- or Au-alloy, is appropriately formed as the underlayer of a mask.

In the method for manufacturing the magnetic recording medium in accordance with the present invention, the mask layer formed on the magnetic layer is made of a material containing Sn or Ga, and the step of removing the mask layer is a dry-etching step using a gas attaining Cl. The gas containing Cl is, for example, a chlorine gas. The chlorine gas enables the mask layer containing Sn or Ga to be converted into an SnCl$_4$ or GaCl$_3$ gas for etching-away. The chlorine gas also makes it possible to reduce residues resulting from the dry etching as well as contamination of the surface of the magnetic recording medium.

In the method for manufacturing the magnetic recording medium in accordance with the present invention, the mask layer formed on the magnetic layer is made of a material containing Ge, and the step of removing the mask layer is a dry-etching step using a gas containing Br. The gas containing Br is, for example, a bromine gas. The bromine gas enables the mask layer containing Ge to be converted into a GeBr$_4$ gas for etching-away. The bromine gas also makes it possible to reduce residues resulting from the dry etching as well as contamination of the surface of the magnetic recording medium.

In the method for manufacturing the magnetic recording medium in accordance with the present invention, the thickness 8 of the recesses in the resist layer 4 resulting from the transfer of the negative patterns of the magnetic recording patterns to the resist layer 4, shown in step D in FIG. 2, is preferably between 0 nm and 10 nm inclusive. When the thickness 8 of the recesses in the resist layer 4 is within this range, during the step of etching the mask layer 3 shown in step E in FIG. 2, the edge of the mask layer 3 can be prevented from sagging, enabling the enhancement of the shielding ability S of the mask layer to shield implanted ions and the magnetic recording pattern formation property L of the mask layer.

In the method for manufacturing the magnetic recording medium in accordance with the present invention, the angle θ of a recessed side portion of the resist layer resulting from the transfer of the negative patterns of the magnetic recording patterns to the resist layer, shown in step D in FIG. 2, is between 90° to 70° inclusive to a substrate surface. When the angle θ of the recessed side portion of the resist layer is within this range, during the step of etching the mask layer 3 shown in step E in FIG. 2, the edge of the mask layer 3 can be prevented from sagging, enabling the enhancement of the shielding ability S of the mask layer to shield implanted ions and the magnetic recording pattern formation property L of the mask layer. The recessed side portion of the resist layer often constitutes a curved surface. In this case, the angle θ to the substrate surface is the angle θ of a plane obtained by averaging the curved surfaces.

Preferably, in the method for manufacturing the magnetic recording medium in accordance with the present invention, a material used for the resist layer 4 in step D in FIG. 2 is cured by irradiation of radiant rays, and the resist layer 4 is irradiated with radiant rays during the step of transferring the patterns to the resist layer 4 using the stamp 5 or after the pattern transfer step. This manufacturing method allows the shape of the stamp 5 to be accurately transferred to the resist layer 4. Thus, during the step of etching the mask layer 3 as shown in step E in FIG. 2, the edge of the mask layer 3 can be prevented from sagging, enabling the enhancement of the shielding ability S of the mask layer to shield implanted ions and the magnetic recording pattern formation property L of the mask layer. The radiant rays in accordance with the present invention are electromagnetic waves in a broad sense, such as heat rays, visible rays, ultraviolet rays, X rays or gamma rays. The material cured by the irradiation of radiant rays is, far example, a thermosetting resin for the heat rays and an ultraviolet curing resin for the ultraviolet rays.

In particular, the method for manufacturing the magnetic recording medium in accordance with the present invention executes the following process to allow the shape of the stamp to be accurately transferred to the resist layer. During the step of transferring the patterns to the resist layer 4 using the stamp 5, the stamp is pressed against the smoothly flowing resist layer, the resist layer is then irradiated with the radiant rays with the stamp pressed against the resist layer to cure the resist layer, and the stamp is separated from the resist layer. To irradiate the resist layer with the radiant rays with the stamp pressed against the resist layer, it is possible to use a method of irradiating the resist layer with radiant rays from the side opposed to the stamp, that is, from the substrate side, a method of selecting a material for the stamp which allows the radiant rays to pass through and irradiating the resist layer with the radiant rays from the stamp side, a method of irradiating the resist layer with radiant rays from the side of the stamp or a method of using radiant rays, such as heat rays, which exhibit a high conductivity with respect to solids to irradiate the resist layer with the radiant rays on the basis of heat transfer from the stamp material or the substrate. In particular, the method for manufacturing the magnetic recording medium in accordance with the present invention preferably uses, as a resist material, an ultraviolet curing resin, such as novolac resin, acrylic ester or cycloaliphatic epoxy, and as a stamp material, glass or resin which exhibits a high permeability with respect to ultraviolet rays.

This method thus reduces the coersive force and remanent magnetization in inter-track regions to the minimum to prevent possible blurring during magnetic recording. The method thus provides a magnetic recording medium with a high surface recording density.

In the method for manufacturing the magnetic recording medium in accordance with the present invention, the implanted ions are preferably at least one species selected from the group consisting of ions of B, P, Si, F, N, H, C, In, Bi, Kr, Ar, Xe, W, As, Ge, Mo and Sn, more preferably at least one species selected from the group consisting of ions of B, P, Si, F, N, H and C or the group consisting of ions of Si, In, Ge, Bi, Ar, Kr, Xe and W, most preferably ions of Si, Kr or Ar.

If the implanted ions are ions of O or N, the effect of the implantation is low owing to the small atomic radius of O and N, leaving a magnetization state in the inter-track region. Furthermore, if the implanted ions are ions of O or N, the magnetic layer is nitrided or oxidized, enhancing the coersive force in the inter-track region to cause blurring when information is written in the magnetic track portion. That is, if these ions are used, it is difficult to demagnetize the magnetic layer, that is, to reduce the Co(002) or Co(110) peak of the magnetic layer and make the magnetic layer amorphous as is done in the case with the implanted ions used in the present invention.

In the present invention, the ions may be implanted in the magnetic layer before or after the protective film is formed on the magnetic layer. If the ion implantation is performed before the protective film is formed on the magnetic layer, the protective film is preferably formed after the ion implantation.

In the present invention, the ions are preferably implanted in the magnetic layer after the protective film is formed on the magnetic layer. This step eliminates the need to form the protective film after the ion implantation, simplifying the manufacturing process. This is also effective for enhancing the productivity and reducing contamination during the process of manufacturing the magnetic recording medium.

In the implantation of the ions by ion beams, the ions are implanted in the magnetic layer using a commercially available ion implanter. In the implantation of the ions in accordance with the present invention, the ions are implanted in the vicinity of the center of the magnetic layer in the depth direction thereof so that a certain amount of atoms are distributed in the depth direction of the magnetic layer. However, an object of the implantation is to demagnetize part of the magnetic layer in which the ions are implanted, penetration depth is not particularly limited. The ion implantation depth is appropriately determined in association with the penetration depth by an acceleration voltage provided by the ion implanter.

To remove the resist layer and the mask layer in accordance with the present invention, a technique, such as dry etching, reactive ion etching or ion milling, is preferably used. In removing the resist layer and the mask layer, it is preferable to also remove part of the protective layer if the magnetic recording medium has the protective layer or to also remove part of the magnetic layer if the magnetic recording medium does not have the protective layer.

In the method for manufacturing the magnetic recording medium in accordance with the present invention, a lubricating layer is preferably formed on the protective layer. Examples of a lubricant used for the lubricating layer include a fluorine-containing lubricant, a hydrogen carbide-containing lubricant and a mixture thereof. The lubricating layer generally has a thickness of 1 to 4 nm.

Figure 3:
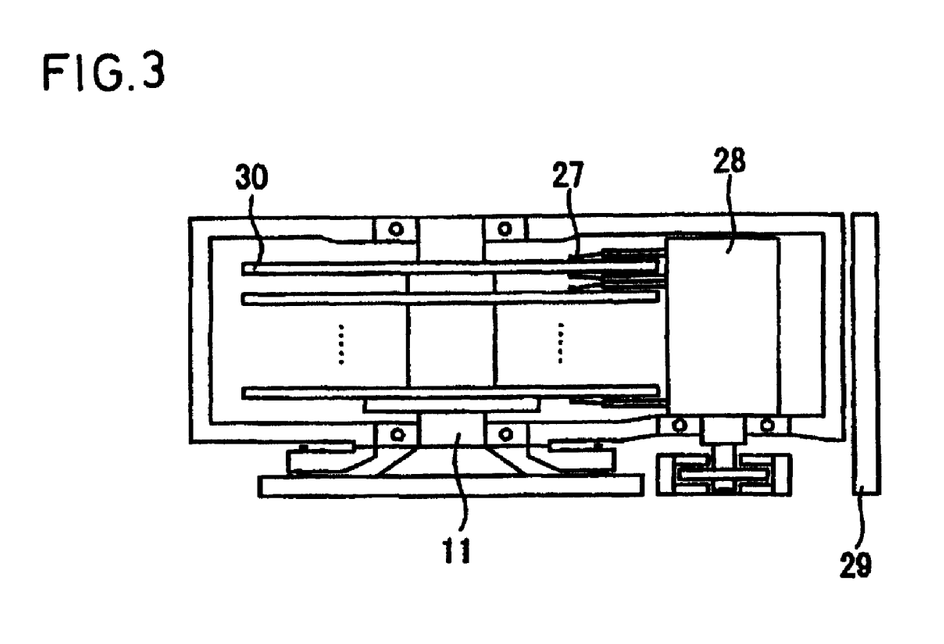
FIG. 3 is a schematic view illustrating the configuration of a magnetic recording and reproducing apparatus in accordance with the present invention.

FIG. 3 shows the configuration of a magnetic recording and reproducing apparatus in accordance with the present invention. The magnetic recording and reproducing apparatus in accordance with the present invention comprises the magnetic recording medium 30 described above, a medium driving section 11 that drives the magnetic recording medium 30 in the recording direction, a magnetic head 27 made up of a recording section and a reproducing section, a head driving section 28 that moves the magnetic head 27 relative to the magnetic recording medium 30, and a recording and reproducing signal system 29 that is a combination of recording signal processing means for inputting signals to the magnetic head 27 and reproducing signal processing means for reproducing output signals from the magnetic head 27. The combination of these components makes it possible to provide a magnetic recording apparatus with a high recording density. Compared with the magnetic recording medium in accordance with the conventional technique of setting the width of a reproducing head smaller than the width of a recording head in order to avoid the adverse effect of a magnetization transition region at the track edge, the discrete-track magnetic recording medium illustrated in the present invention has the magnetically discontinuous recording tracks, allowing both widths to be set almost the same. This makes it possible to provide sufficient reproduction outputs and a high SNR.

Moreover, when the reproducing section of the magnetic head is composed of a GMR or TMR head, a sufficient signal intensity can be obtained even at a high recording density. A magnetic recording apparatus with a high recording density can thus be realized. When the magnetic head floats to a height of 0.005 µm to 0.020 µm, which is lower than that used for the conventional technique, the output is enhanced to provide a high apparatus SNR. A highly reliable magnetic recording apparatus with a large capacity can thus be provided. Furthermore, a combination with a signal processing circuit based on the maximum likelihood decoding method further enhances the recording density. For example, a sufficient SNR can be obtained even if recording and reproducing operations are performed at a track density of 100 k tracks/inch or more, a linear recording density of 1000 kbits/inch or more and a recording density of 100 Gbits per square inch or more. Examples of the present invention will be described below.

Example 1

A vacuum chamber with a glass substrate for an HD set therein was pre-evacuated to $1.0 \times 10^{-5}$ Pa or less. The material for the glass substrate was crystallized glass composed of $Li_2Si_2O_5$, $Al_2O_3$—$K_2O$, MgO—$P_2O_5$ or $Sb_2O_3$—ZnO. The glass substrate had an outside diameter of 65 mm, an inside diameter of 20 mm and an average surface roughness (Ra) of 2 Å.

Thin films were sequentially stacked on the glass substrate. Specifically, a soft magnetic layer of FeCoB, an intermediate layer of Ru and a magnetic layer of 70Co-5Cr-15Pt-10SiO$_2$ alloy were first deposited in this order using the DC sputtering, and a protective film layer of C (carbon) was then formed by the P-CVD method. The FeCoB soft magnetic layer had a film thickness of 600 Å. The Ru intermediate layer had a film thickness of 100 Å. The magnetic layer had a film thickness of 150 Å. The C (carbon) protective film layer had an average film thickness of 2 nm.

A mask layer was formed on the resultant stacked structure by sputtering. The mask layer was made of Ta and had a film thickness of 60 nm.

A resist was then coated on the mask layer by spin coating. The resist was made of a novolac resin which is an ultraviolet curing resin and had a film thickness of 100 nm.

A stamp of glass having negative patterns of magnetic recording patterns was then pressed against the resist layer at a pressure of 1 MPa (about 8.8 kgf/cm$^2$). In that state, the resist was irradiated with ultraviolet rays having a wavelength 250 nm for 10 seconds from above the glass stamp, which exhibited a permeability of 95% or more for ultraviolet rays. The resist was thus cured. The stamp was then separated from the resist layer to transfer the magnetic recording patterns to the resist layer. In the magnetic recording patterns transferred to the resist layer, protrusions on the resist traced circumferences each having a width of 120 nm, and recesses in the resist traced circumferences each having a width of 60 nm. The resist layer had a layer thickness of 80 nm, and the recesses in the resist layer had a thickness of about 5 nm. The angle of the recesses in the resist layer to the substrate surface was almost 90°.

Regions of the resist layer corresponding to the recesses and the corresponding regions of the underlying Ta layer were removed by dry etching using the mask layer. The dry etching conditions for the resist included an O$_2$ gas flow rate of 40 sccm, a pressure of 0.3 Pa, a high-frequency plasma power of 300 W, a DC bias of 30 W and an etching time of 10 seconds, and those for the Ta layer included a CF$_4$ gas flow rate of 50 sccm, a pressure of 0.6 Pa, a high-frequency plasma power of 500 W, a DC bias of 60 W and an etching time of 30 seconds.

Ions were subsequently implanted in the magnetic layer from the front surface of the resist layer. The implanted ions were Ar ions, the amount of the ions implanted was $5 \times 10^{16}$ atoms/cm$^2$, and the acceleration voltage was 20 keV. The resist, mask layer and protective film were partly removed. A carbon protective film was then formed again in a thickness of 4 nm by the CVD method, and a lubricating material is coated on the carbon protective film. A magnetic recording medium was thus manufactured.

Examples 2 to 28

Magnetic recording media were manufactured under conditions similar to those in Example 1 except for the material and film thickness of the mask which were changed as shown in Table 1. In Example 28, the resist material was changed from the novolac resin to a thermosetting resin, and the curing treatment was changed from the ultraviolet irradiation to a heat treatment at 150° C. for 30 minutes.

Comparative Example 1

A magnetic recording medium was manufactured under conditions similar to those in Example 1 except that SOG (Spin On Glass) was used as the mask material and that the SOG layer was directly imprinted using the stamp without the resist layer. The imprinting operation was preformed at a pressure of 187 MPa (about 1.66 tons/cm$^2$). The mask layer was cured by heating the mask layer at 150° C. for 30 minutes.

Comparative Example 2

A magnetic recording medium was manufactured under conditions similar to those in Example 1 except that a thermosetting resin was used as the mask material and that the thermosetting resin layer was directly imprinted using the stamp without the resist layer. The imprinting operation was preformed at a pressure of 124 MPa (about 1.10 t/cm$^2$). The mask layer was cured by heating the mask layer at 150° C. for 30 minutes.

The manufactured magnetic recording media were evaluated for electromagnetic conversion properties using a spin stand. For heads for the evaluation, a vertical recording head was used for recording operations, and a TuMR head was used for reading operations. As the electromagnetic conversion properties, an SNR value and a 3 T-squash observed when 750 kFCI signals were recorded in the media were measured.

The magnetic recording pattern properties L, $L_{initial}$ and $L_{after}$ were measured and calculated using an AFM and an MFM manufactured by Digital Instrument Co., Ltd. The measurement renditions for the AFM and MFM included a 10-µm visual field, a tapping mode with a resolution of 256×256, and a sweeping speed of 1 µm/sec.

Table 1 below shows the results of the evaluation. For example, in Example 1, the SNR was 12.6 dB and the 3 T-squash was 80%, indicating that the magnetic recording medium had excellent electromagnetic conversion properties. This is conceived to be because the magnetic recording medium had a high surface smoothness to stabilize the head floating property and because the magnetization state of the inter-track region disappeared completely over a predetermined range.

TABLE 1

| | Mask material | Mask Film thickness (nm) | Angle of Resist layer side portion θ (dog) | Thickness of resist layer recess (nm) | Ion shielding ability S | Magnetic pattern property L | 3T-squash (%) | SNR (dB) |
|---|---|---|---|---|---|---|---|---|
| Ex. 1 | Ta | 60 | 90 ± 5 | 5 | 0.99 | 0.01 | 80 | 12.6 |
| Ex. 2 | W | 60 | 90 ± 5 | 6 | 1 | 0.02 | 82 | 12.7 |
| Ex. 3 | Ta | 50 | 90 ± 5 | 4 | 0.9 | 0.02 | 81 | 12.1 |
| Ex. 4 | Ta | 40 | 90 ± 5 | 5 | 0.6 | 0.01 | 76 | 11.6 |
| Ex. 5 | Ta | 100 | 90 ± 5 | 6 | 1 | 0.01 | 82 | 12.8 |
| Ex. 6 | W | 40 | 90 ± 5 | 6 | 0.8 | 0.01 | 75 | 12 |
| Ex. 7 | W | 30 | 90 ± 5 | 9 | 0.6 | 0.03 | 72 | 11.5 |
| Ex. 8 | TaN | 60 | 90 ± 5 | 5 | 0.98 | 0.01 | 81 | 12.5 |
| Ex. 9 | WN | 60 | 90 ± 5 | 6 | 0.99 | 0.01 | 80 | 12.4 |
| Ex. 10 | Ni/Ta | 20/40 | 90 ± 5 | 9 | 1 | 0.01 | 82 | 12.7 |
| Ex. 11 | Ni/W | 20/40 | 90 ± 5 | 6 | 1 | 0.01 | 81 | 12.8 |
| Ex. 12 | Si | 100 | 90 ± 5 | 6 | 0.99 | 0.01 | 82 | 12.5 |
| Ex. 13 | SiO$_2$ | 100 | 90 ± 5 | 5 | 0.98 | 0.01 | 81 | 12.5 |
| Ex. 14 | Ta$_2$O$_3$ | 100 | 90 ± 5 | 6 | 0.99 | 0.01 | 79 | 12.4 |
| Ex. 15 | Re | 60 | 90 ± 5 | 7 | 0.99 | 0.01 | 80 | 12.7 |
| Ex. 16 | Mo | 100 | 90 ± 5 | 6 | 0.96 | 0.01 | 79 | 12.6 |
| Ex. 17 | Ti | 120 | 90 ± 5 | 6 | 0.96 | 0.01 | 78 | 12.6 |
| Ex. 18 | V | 120 | 90 ± 5 | 6 | 0.04 | 0.01 | 79 | 12.5 |
| Ex. 19 | Nb | 120 | 90 ± 5 | 4 | 0.93 | 0.01 | 81 | 12.7 |
| Ex. 20 | Sn | 120 | 90 ± 5 | 5 | 0.99 | 0.01 | 82 | 12.3 |
| Ex. 21 | Ga | 100 | 90 ± 5 | 7 | 0.93 | 0.01 | 81 | 12.6 |
| Ex. 22 | Ga | 100 | 90 ± 5 | 8 | 0.96 | 0.01 | 80 | 12.5 |
| Ex. 23 | As | 100 | 90 ± 5 | 9 | 0.98 | 0.02 | 79 | 12.4 |
| Ex. 24 | Ta | 60 | 85 ± 5 | 10 | 0.87 | 0.08 | 76 | 12.1 |
| Ex. 25 | Ta | 60 | 75 ± 5 | 10 | 0.94 | 0.12 | 72 | 11.8 |
| Ex. 26 | C | 100 | 90 ± 5 | 7 | 0.2 | 0.27 | 56 | 10.4 |
| Ex. 27 | SOG | 100 | 90 ± 5 | 7 | 0.4 | 0.32 | 59 | 10.7 |
| Ex. 28 | Ta | 60 | 65 ± 5 | 40 | 0.97 | 0.22 | 85 | 11.1 |

TABLE 1-continued

|  | Mask material | Mask Film thickness (nm) | Angle of Resist layer side portion θ (dog) | Thickness of resist layer recess (nm) | Ion shielding ability S | Magnetic pattern property L | 3T-squash (%) | SNR (dB) |
|---|---|---|---|---|---|---|---|---|
| Comp. Ex. 1 | SOG | 100 | 65 ± 5 | 40 | 0.4 | 0.37 | 51 | 10.7 |
| Comp. Ex. 2 | Thermo-setting resin | 100 | 65 ± 5 | 40 | 0.4 | 0.29 | 54 | 10.9 |

INDUSTRIAL APPLICABILITY

For magnetic recording apparatuses that face technical difficulties associated with the increased recording density, the present invention drastically increases the recording density while ensuring recording and reproducing properties equivalent or superior to those achieved by the conventional techniques. The present invention also reduces the coersive force and remanent magnetization in the inter-pattern regions to the minimum to prevent possible blurring during magnetic recording. This increases the surface recording density. In particular, for discrete-track magnetic recording media manufactured by forming recesses and protrusions on a magnetic layer preformed on the substrate, the present invention eliminates a magnetic layer removing step executed for the conventional magnetic layer processing method, substantially simplifying the manufacturing process. The present invention also provides a manufacturing method with reduced contamination risks and a useful magnetic recording medium with an excellent head floating property.

The invention claimed is:

1. A method for manufacturing a magnetic recording medium having magnetically separate magnetic recording patterns on at least one surface of a nonmagnetic substrate, the method comprising in the order recited, the steps of:
    forming a magnetic layer on the nonmagnetic substrate;
    forming a mask layer including at least one layer of one species selected from a group consisting of Mo, Ta and W on the magnetic layer;
    forming a resist layer on the mask layer;
    transferring negative patterns of the magnetic recording patterns to the resist layer using a stamp;
    removing portions of the mask layer which correspond to recesses of the negative patterns that are formed in the resist layer;
    implanting ions in the magnetic layer from a resist layer-side surface to partly demagnetize the magnetic layer; and
    removing the resist layer and the mask layer.

2. The method for manufacturing the magnetic recording medium according to claim 1, wherein the mask layer formed on the magnetic layer has a multilayer structure.

3. The method for manufacturing the magnetic recording medium according to claim 1, wherein the step of removing the mask layer is a dry etching step using a gas containing F.

4. The method for manufacturing the magnetic recording medium according to claim 1, wherein the resist layer has recesses formed therein after the step of transferring the negative patterns of the magnetic recording patterns to the resist layer, which have a thickness in a range of 0 nm to 10 nm.

5. The method for manufacturing the magnetic recording medium according to claim 4, wherein the resist layer having the recesses formed therein after the step of transferring the negative patterns of the magnetic recording patterns to the resist layer has a side portion forming an angle in a range of 90 to 70° relative to a surface of the nonmagnetic substrate.

6. The method for manufacturing the magnetic recording medium according to claim 1, wherein the resist layer is made of a material cured by irradiation with radioactive rays, and the resist layer is irradiated with radioactive rays during or after the step of transferring the patterns to the resist layer using the stamp.

7. The method for manufacturing the magnetic recording medium according to claim 6, wherein the radioactive rays are ultraviolet rays.

8. The method for manufacturing the magnetic recording medium according to claim 2, wherein the step of removing the mask layer is a dry etching step using a gas containing F.

* * * * *